PERFORMANCE MATCHED COMPLEMENTARY PAIR TRANSISTORS

Filed Sept. 3, 1970 2 Sheets-Sheet 1

INVENTOR
HITENDRA N. GHOSH

BY Robert J Haase
ATTORNEY

May 1, 1973 H. N. GHOSH 3,730,786

PERFORMANCE MATCHED COMPLEMENTARY PAIR TRANSISTORS

Filed Sept. 3, 1970 2 Sheets-Sheet 2

1

3,730,786
PERFORMANCE MATCHED COMPLEMENTARY PAIR TRANSISTORS

Hitendra N. Ghosh, Poughkeepsie, N.Y., assignor to International Business Machines Corporation, Armonk, N.Y.

Filed Sept. 3, 1970, Ser. No. 69,205
Int. Cl. H01l 7/36, 11/00, 19/00
U.S. Cl. 148—175 6 Claims

ABSTRACT OF THE DISCLOSURE

A method for fabricating a complementary pair of transistors having closely matched characteristics. A high performance npn transistor is matched to a pnp transistor whose performance is upgraded through the use of a doped oxide for simultaneously diffusing the base of the pnp transistor and the emitter of the npn transistor. After the base diffusion is completed, the doped oxide is etched away only from the base region of the pnp transistor and diffusion conditions are reestablished. The base doping of the pnp transistor then redistributes to produce a lower surface concentration and a sharper gradient at the collector base junction while the doped oxide remaining over the npn emitter acts as a continuing source of emitter impurity for enhanced emitter efficiency.

BACKGROUND OF THE INVENTION

Efforts have been directed at producing, on a common monolithic semiconductor substrate, complementary transistor pairs having matched characteristics. Generally, because of the lesser mobility of holes relative to electrons, pnp transistor characteristics resulting from such prior efforts have been somewhat inferior to those of the state-of-the-art npn transistors. Although techniques are available for tailoring impurity profiles in the respective emitter, base and collector regions of transistors to obtain desired performance, the techniques must be used in proper combination to avoid undesirable impact on each other where it is desired to produce a matched complementary transistor pair on the same monolithic semiconductor substrate. Moreover, it is important that the process by which the complementary transistor pair is produced be maximally compatible with existing technology without compromising the desirable operating characteristics of independently made npn and pnp transistors or increasing the number of diffusion process steps with attending higher cost.

SUMMARY OF THE INVENTION

The present invention is a method for fabricating matched high performance npn and upgraded performance pnp transistors on the same monolithic semiconductor substrate. An epitaxial layer of one conductivity type is deposited on a substrate of the opposite conductivity type. Isolation walls and a subcollector are formed in the epitaxial layer region in which the npn transistor is to be produced at the same time that an isolated region is produced for the pnp transistor. The original epitaxial layer impurity concentration is utilized for the collector region for the npn transistor but forms no part of the pnp transistor per se. After the base region is diffused in the npn transistor, an n-type doped oxide (preferably arsenic doped oxide) is placed over the emitter area of the npn transistor and the base of the pnp transistor. The structure then is subjected to a drive-in heat treatment during which the impurity is simultaneously driven into the emitter region of the npn transistor and into base region of the pnp transistor.

The doped oxide is removed from the base region of the pnp transistor and allowed to remain over the emitter

2 region of the npn transistor. A second drive-in step causes the redistribution of the impurity in the base region of the pnp transistor (whereby the surface impurity concentration is lowered and the impurity gradient at the collector base junction is increased) while the npn total emitter impurity concentration is enhanced. Conventional masking and diffusion steps are provided to form the emitter of the pnp transistor as well as the necessary contacts and metallization to complete the devices.

An important feature of the present invention is that the emitter doping of the npn transistor is reinforced to a desired high concentration without requiring the registration of an additional diffusion mask. The good match of arsenic to the silicon crystalline lattice facilitates the diffusion of a relatively high concentration of arsenic which is necessary both for a high total impurity concentration in the base region of the pnp transistor and in the emitter region of the npn transistor. Thus, a pnp transistor is produced having upgraded performance characteristics closely matching those of a high performance npn transistor utilizing available and established processing technology.

DESCRIPTION OF THE PREFERRED EMBODIMENT

Figure 1:
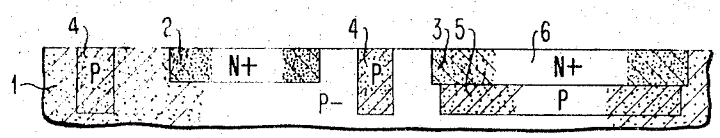
FIGS. 1 through 6, are simplified cross-sectional views of a pair of complementary transistors at successive stages in the fabrication process of the present invention.
Figure 5:
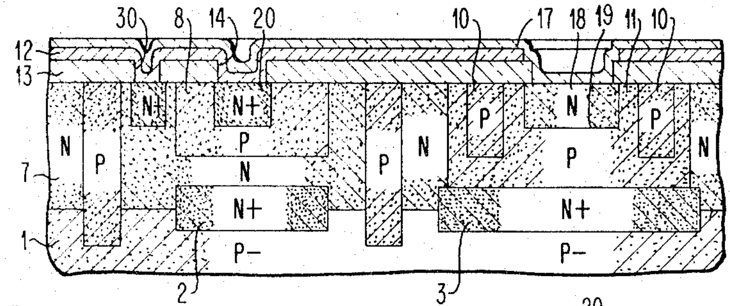
Figure 6:
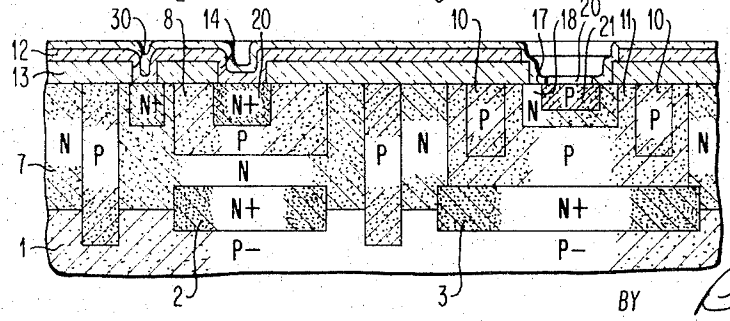
Figure 7:
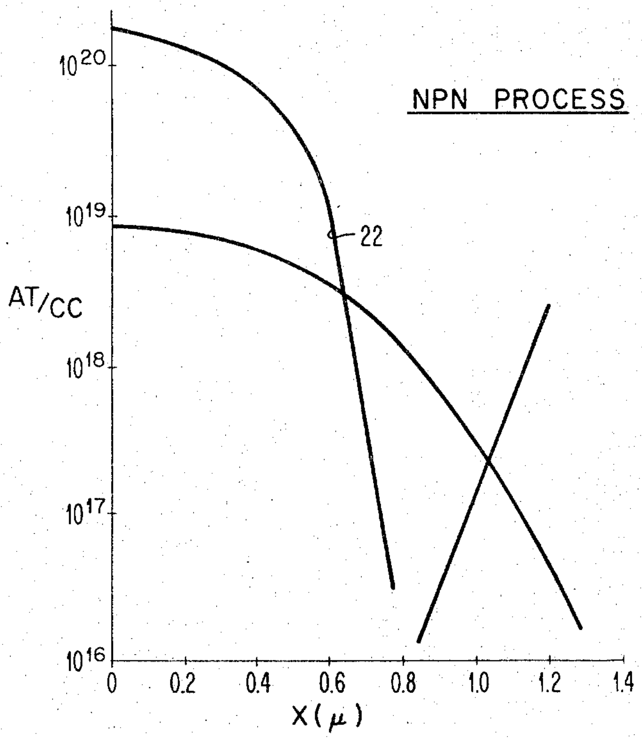
FIG. 7 is a typical impurity profile plot of the npn transistor of FIG. 6.
Figure 8:
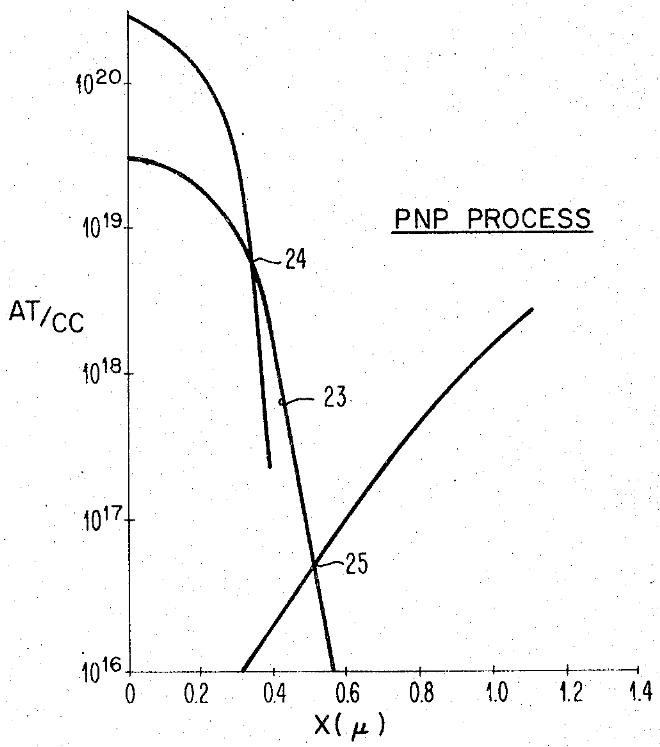
FIG. 8 is a typical impurity profile plot of the pnp transistor of FIG. 6.

FIGS. 1–6 will be described in terms of exemplary process parameter values on which the typical impurity profile plots of FIGS. 7 and 8 are based. Referring to FIG. 1, P-substrate 1 is provided having a resistivity in the range from 10 to 20 ohm cm. Substrate 1 is oxidized to produce a thickness of 5,000 A. of silicon oxide (not shown) which is masked to provide windows for P diffusions 4 and 5. The P diffusions may be made, for example, by a boron capsule diffusion process at 1,000° C. for 120 minutes producing a boron surface concentration of $C_0=2\times10^{20}$ atoms per cubic cm., a sheet resistance of 12.7 Ω/□ and an initial junction depth of 1.1 microns. The boron diffusion is followed by a second oxidation masking cycle comprising, for example, a dry oxygen-steam-dry oxygen sequence for 5 minutes-60 minutes-5 minutes, respectively, at 970° C. Following this oxidation step, the sheet resistance of the boron diffusion in areas 4 and 5 is increased to 25.5 Ω/□, the junction depth is decreased to 1.035 microns and the surface concentration is reduced to $4.84\times10^{19}$ at/cc. Approximately 4800 A. of silicon dioxide grow over substrate 1 under the exemplary conditions just given.

Diffusion windows are opened in the 4800 A. oxide layer (not shown) for N+ diffusions 2 and 3. Diffusion 2 serves as the subcollector of the npn transistor to be formed later while diffusion 3 serves to isolate the collector region of the pnp transistor to be produced later. The N+ diffusions in areas 2 and 3 may be accomplished, for example, by an arsenic capsule diffusion process at 1050° C. for 215 minutes to produce a surface concentration of $2.5\times10^{20}$ at/cc., a sheet resistance of 9.83 Ω/□ and an initial junction depth of one micron. During the time of the arsenic diffusion, the previously diffused boron impurities redistribute to change the boron sheet resistance to 24.7 Ω/□ and deepen the boron junction depth to 2.2 microns. The boron diffusion in region 5 only very slightly reduces the concentration of the over-lapping arsenic diffusion in region 6.

Substrate 1 again is oxidized using, for example, an oxygen-steam-oxygen cycle for 5–60–5 minutes, respectively, to create a step (not shown) in the arsenic diffusion areas for mask alignment purposes. The boron and arsenic profiles further redistribute during this oxidation heat treatment.

Figure 2:
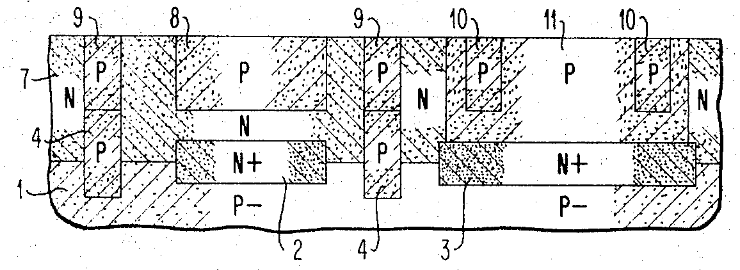

The oxides (not shown) then are removed and the N-type conductivity epitaxial layer 7 of FIG. 2 is formed on substrate 1 at 1210° C. for 3.6 minutes to a thickness of 2.36 microns having a resistivity of 0.5 ohm/cm. Epitaxial layer 7 then is covered with an oxide layer (not shown) resulting from an oxidation treatment at 970° C. using oxygen-steam-oxygen for 5–60–5 minutes, respectively, to yield an oxide thickness of 4800 A. Diffusion windows are opened in the oxide layer to form the isolation area 9 and the base region 8 of the npn transistor and the collector contact area 10 for the pnp transistor. In a typical case, the P diffusions are made using boron at 1,000° C. for 30 minutes to produce a surface impurity concentration of $5\times10^{19}$ at/cc., a sheet resistance of 112 Ω/□ and an initial junction depth of 0.54 micron. Isolation diffusion 9 merges with the outdiffused region 4 to form isolation walls through epitaxial layer 7 reaching into substrate 1. P diffused area 5 of FIG. 1 also continues its outdiffusion into epitaxial layer 7 during the oxidation heat treatments discussed above to form collector region 11 for the pnp transistor reaching completely through epitaxial layer 7 to the upper surface thereof. The relatively slow diffusion of the arsenic originally placed in regions 2 and 3 of FIG. 1 retain approximately the same positions in FIG. 2.

Figure 3:
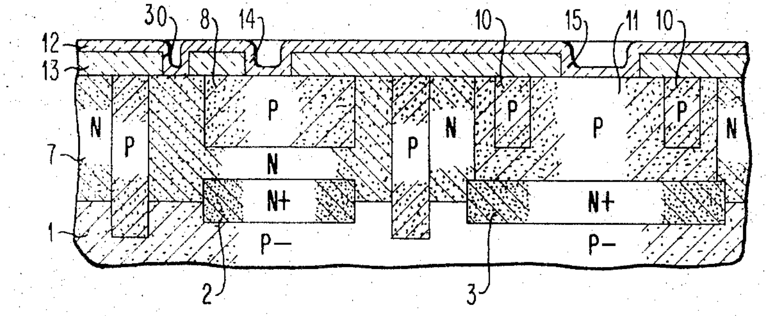

In accordance with the method of the present invention, the performance characteristics of the pnp transistor are upgraded to substantially match those of a high performance npn transistor by the technique of providing a maximum amount of total impurity in the base region of the pnp transistor with a relatively high impurity gradient in the portion of the base region contiguous to the base-collector junction. This is achieved simultaneously with the emitter diffusion of the npn transistor by providing an arsenic-doped oxide layer 12 overlying silicon dioxide masking layer 13 as shown in FIG. 3.

Silicon dioxide layer 13, in the exemplary case under consideration, is grown at 970° C. using oxygen-steam for 4 minutes each to grow about 433 A. of thermal oxide followed by the deposition of 4,000 A. pyrolytic oxide. Diffusion windows 14, 15 and 30 are opened in the silicon dioxide compoiste layer 13 for the emitted of the npn transistor, the base of the pnp transistor and the collector contact area for the npn transistor, respectively. Arsenic doped oxide layer 12 is deposited and the arsenic is driven in at a temperature of 1,000° C. for 10 minutes to provide a surface concentration of $1.75\times10^{20}$ atoms per cc., a sheet resistance of 115 Ω/□ and initial emitter and base junction depths of 0.2 micron.

Figure 4:
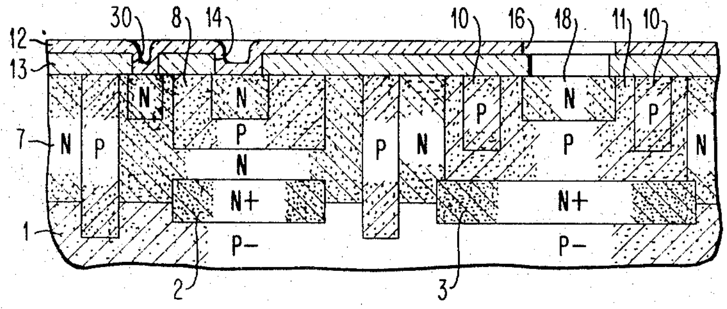

The arsenic doped oxide layer 12 then is removed in the region 16 overlying the base of pnp transistor as shown in FIG. 4. Masking oxide layer 17 of FIG. 5 is formed over the base area of the pnp transistor for the subsequent emitter diffusions of the pnp transistor. Oxide layer 17 may be formed by growing 433 A. of oxide using oxygen-steam for 4 minutes each at 970° C. and then depositing an overlying pyrolytic oxide layer of about 4,000 A. thickness. During a subsequent impurity drive-in, the arsenic impurities already present in the base region 18 of the pnp transistor redistributes to lower the surface concentration while increasing the impurity gradient at the base-collector junction 19 during the same time that the arsenic doped oxide 12 continues to act as a source of emitter impurity maintaining an emitter impurity surface concentration at about $1.75\times10^{20}$ atoms per cc. The aforementioned subsequent impurity drive-in is performed in an inert atmosphere such as argon or nitrogen at 1,000° C. for 600 minutes.

After the redistribution of the base impurities in the pnp transistor and after the enhancement of the emitter impurities in the pnp transistor, the following parameter values are obtained:

| | Arsenic pnp base region | Arsenic npn emitter region |
|---|---|---|
| Surface impurity concentration, atoms/cc | $3\times10^{19}$ | $1.75\times10^{20}$ |
| Sheet resistance, | 91Ω/□ | 15.7 |
| Junction depth, micron | 0.6 | 0.8 |

A diffusion window 20 is opened in the oxide layer 17 for the emitter of the pnp transistor as shown in FIG. 6. The emitter 21 is formed by diffusing boron for 12 minutes at 1,000° C. to yield a surface concentration of $3\times10^{20}$ at./cc., a sheet resistance of 22Ω/□ and a junction depth of 0.45 micron. The complementary npn and pnp transistor structures then may be completed using conventional techniques to provide appropriate contacts and metallization.

The typical process parameter values cited in the foregoing preferred embodiment of the present invention yields the npn and pnp transistor impurity profiles represented by FIGS. 7 and 8, respectively. Said profiles may be varied somewhat to achieve other desired shapes by suitable adjustment of the process parameter values by changing, for example, the surface impurity concentrations, diffusion times and temperatures, etc. as is understood by those skilled in the art, It will be observed from emitter profile 22 of FIG. 7 and base profile 23 of FIG. 8 that relatively shallow and steep (high gradient) profiles have been achieved as is characteristic of the use of arsenic. The relatively steep base profile 23 results in a relatively thin base region for the pnp transistor (the distance in the epitaxial layer between emitter junction 24 and collector junction 25) which compensates for the lesser mobility of the hole minority carriers travelling through the base region. As previously mentioned, the good match of arsenic to the silicon crystalline lattice enhances the total amount of impurity within the base region of the pnp transistor aiding further in a reduction of base width for a given base resistance. These characteristics together cooperate in upgrading the performance of the pnp transistor to substantially match the performance of the npn transistor represented by the diffusion profiles of FIG. 7. This is further shown in the following table of parameter values of the complementary transistors resulting from the disclosed preferred embodiment of the present invention. The table is based upon typical identical geometry, i.e., $0.1\times0.5$ mil emitters and 0.2 mil spacings for both the npn and pnp transistors:

| | NPN | PNP |
|---|---|---|
| Emitter junction depth (micro inches) | 25.6 | 14.4 |
| Collector junction depth (micro inches) | 40.4 | 20.7 |
| Punch through voltage | 192 | 68.1 |
| Collector avalanche breakdown voltage | 12 | 8.4 |
| Base sheet resistance (Ω/□) | 240 | 91 |
| Dumbbell resistor, ohms | 2,270 | 2,500 |
| $f_T$ (at 5 ma., $V_{CB}=0$) in $GH_2$ | 1.37 | 1.63 |
| $r_b$ $C_C$(at 5 ma., $V_{CB}=0$) in picoseconds | 25.6 | 21.6 |
| Emitter transition capacitance (picofraads/cm.$^2$ | $2.74\times10^5$ | $3.6\times1^5$ |
| Collector transition capacitance (picofarads/cm.$^2$) | $1.17\times10^5$ | $1.28\times10^5$ |

It should be noted that the npn and pnp transistors resulting from the exemplary parameter values of the disclosed preferred embodiment of the invention are avalanche breakdown limited. Accordingly, it may be convenient to reduce the punch through voltage values indicated in the table by alteration of the diffusion parameters to produce a reduced base width in the transistors. Reduced base width, in turn, can be expected to yield higher values for $f_T$ with addition of enhanced performance of both transistors.

While this invention has been particularly described with reference to the preferred embodiments thereof, it will be understood by those skilled in the art that the foregoing and other changes in form and details may be made therein without departing from the spirit and scope of the invention:

What is claimed is:

1. A method for fabricating a complementary pair of transistors on common monolithic semiconductor material, said method comprising:
   providing a collector region for one of said complementary transistors and a collector region for the other of said complementary transistors in the same monolithic semiconductor material, said collector regions being electrically isolated from each other,
   forming a base region in said collector region of said one transistor,
   forming a masking layer having diffusion windows over said base region of one transistor and over said collector region of said other transistor,
   forming a doped layer of the same conductivity type as said collector region of said one transistor overlying said masking layer at least at the locations of said diffusion windows,
   heating said doped layer and said monolithic semiconductor material to diffuse the impurity from said doped layer simultaneously into said base region of said one transistor and into said collector region of said other transistor to form the emitter of said one transistor and the base of said other transistor, respectively,
   removing said doped layer from said base region diffusion window of said other transistor,
   heating said doped layer and said monolithic semiconductor material to diffuse further said impurity from said doped layer into said emitter of said one transistor, and
   placing impurity of the same conductivity type as said collector of said other transistor into said base of said other transistor to form an emitter.

2. The method defined in claim 1 wherein:
   said one transistor and said other transistor are npn and pnp transistors, respectively.

3. The method defined in claim 1 wherein:
   said semiconductor material is an epitaxial layer on a substrate, said complementary pair of transistors being formed in said epitaxial layer.

4. The method defined in claim 3 wherein:
   said epitaxial layer and said substrate are of opposite conductivity types, said epitaxial layer being of the same conductivity type as said collector of said one transistor.

5. The method defined in claim 2 wherein:
   said layer overlying said masking layer is doped with arsenic.

6. The method defined in claim 4 wherein said collector region of said other transistor is formed by outdiffusing an impurity region in said substrate completely through said epitaxial layer, said impurity region being of the same conductivity type as the substrate.

References Cited

UNITED STATES PATENTS

| | | | |
|---|---|---|---|
| 3,327,182 | 6/1967 | Ksinko | 317—235 |
| 3,465,215 | 9/1969 | Bohannon et al. | 317—235 |
| 3,391,035 | 7/1968 | Mackintosh | 148—187 |
| 3,423,653 | 1/1969 | Chang | 317—235 |
| 3,450,961 | 6/1969 | Tsai | 317—235 |
| 3,474,309 | 10/1969 | Stehlin | 317—235 |
| 3,566,218 | 2/1971 | Widlar et al. | 317—235 |
| 3,607,465 | 9/1971 | Frouin | 148—175 |
| 3,502,951 | 3/1970 | Hunts | 317—235 |
| 3,489,622 | 1/1970 | Barson et al. | 148—188 X |

FOREIGN PATENTS

| | | | |
|---|---|---|---|
| 1,583,864 | 10/1969 | France | 148—188 UX |

OTHER REFERENCES

Ashar et al. 'Semiconductor Device Structure and Method of Making" IBM Tech. Discl. Bull., vol. 11, No. 11, April 1969, pp. 1529-1530.

Carlsen, G. S. "Multiple Diffusion for Integrated . . . Single Diffusion," IBM Tech. Discl. Bull., vol. 9, No. 10, March 1967, pp. 1456-1458.

HYLAND BIZOT, Primary Examiner

W. G. SABA, Assistant Examiner

U.S. Cl. X.R.

29—576, 578; 117—201; 148—188, 191; 317—235 R